US006297082B1

(12) United States Patent
Lin et al.

(10) Patent No.: US 6,297,082 B1
(45) Date of Patent: Oct. 2, 2001

(54) METHOD OF FABRICATING A MOS TRANSISTOR WITH LOCAL CHANNEL ION IMPLANTATION REGIONS

(75) Inventors: Tony Lin, Kaohsiung Hsien; Alice Chao; Jih-Wen Chou, both of Hsinchu, all of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/383,033

(22) Filed: Aug. 25, 1999

(51) Int. Cl.[7] .............................................. H01L 21/8238
(52) U.S. Cl. .......................... 438/217; 438/296; 438/212; 438/221; 438/224; 438/289
(58) Field of Search .................................... 438/217, 218, 438/221, 224, 279, 283, 289, 296

(56) References Cited

U.S. PATENT DOCUMENTS

| | | | |
|---|---|---|---|
| 5,489,543 | * | 2/1996 | Hong . |
| 5,858,826 | * | 1/1999 | Lee et al. . |
| 5,970,345 | * | 10/1999 | Hattangady et al. . |
| 5,985,706 | * | 11/1999 | Gilmer et al. . |
| 6,030,862 | * | 2/2000 | Kepler . |
| 6,033,943 | * | 3/2000 | Gardner . |
| 6,096,611 | * | 8/2000 | Wu . |
| 6,117,717 | * | 9/2000 | Carbone et al. . |
| 6,124,177 | * | 9/2000 | Lin et al. . |
| 6,137,144 | * | 10/2000 | Tsao et al. . |
| 6,165,825 | * | 12/2000 | Odake . |

* cited by examiner

Primary Examiner—Charles Bowers
Assistant Examiner—Stephen W. Smoot
(74) Attorney, Agent, or Firm—Thomas, Kayden, Horstemeyer & Risley, LLP

(57) ABSTRACT

A fabrication method for a metal oxide semiconductor (MOS) transistor involves forming gate oxide layers of different thicknesses on a core region and a input/output (I/O) region. After forming wells in the substrate, two implantation regions for providing a threshold voltage ($V_T$) adjustment and an anti-punch through layer are formed respectively in a P-well and a N-well of the core region as well as a P-well and a N-well of the I/O region. The method involves forming a pattern mask on the gate oxide layer, wherein the pattern mask has an opening, which may be a channel that corresponds to the P-well of the core region. With the pattern mask serving as an ion implantation mask, two implantation regions for providing the $V_T$ adjustment and the anti-punch through layer are formed in the P-well of the core region. After the pattern mask is removed, the steps described above are repeated in order to form implantation regions in other regions, but the sequence of the steps can be swapped around at will. The subsequent process for the MOS transistor is then performed.

11 Claims, 4 Drawing Sheets

METHOD OF FABRICATING A MOS TRANSISTOR WITH LOCAL CHANNEL ION IMPLANTATION REGIONS

BACKGROUND OF THE INVENTION

1. Field of Invention

The present invention relates to a method for fabricating a semiconductor. More particularly, the present invention relates to a fabrication method for a metal oxide semiconductor (MOS) transistor combining a dual threshold voltage process and a local channel implantation.

2. Description of Related Art

Conventionally, in the manufacture of the MOS transistor, a field oxide layer for defining an active region is formed in the substrate. An ion implantation step is then performed so that a well is formed in the active region, and two implantation regions are globally formed for providing a threshold voltage ($V_T$) adjustment and an anti-punch through layer respectively. On the substrate, gates are formed with spacers located on sidewalls of the gate. Furthermore, source/drain (S/D) regions having lightly doped drains (LDD) are formed underneath both sides of the gate in the substrate. An implantation region, which provides the anti-punch through layer, is located below the S/D region, wherein a junction capacitance, which affects the efficiency of the device, exists between the implantation region and the S/D region.

As the integration of the device increases with a decrease in the line width, a shallow trench isolation (STI) becomes the necessary isolation structure for the device when the process advances to the technology of below 0.25 micron. However, different outcomes are produced due to the device characteristics if the field oxide layer is substituted with the STI to isolate the device.

It was known that if the field oxide layer serves as a device isolation structure, $V_T$ of the transistor increases when the length of the gate (i.e. channel length) increases. This is known as a short channel effect (SCE). As the width of the gate increases, $V_T$ of the transistor reduces as a consequence of a narrow channel effect (NCE). However, if the STI is substituted for device isolation, $V_T$ of the transistor increases at first and then decreases when the gate width gradually increases. This phenomenon is different from the outcome produced when the field oxide layer is used, and is therefore known as a reverse short channel effect (R-SCE). When the width of the gate increases, $V_T$ of the transistor increases as a consequence of a reverse narrow channel effect (R-NCE).

As the R-SCE and the R-NCE both occur in case where the STI is used, it becomes more difficult in terms of designing the gate when a transistor having different $V_T$ is designed during the dual threshold voltage process. Thus, it is not easy to control the efficiency of the device.

When the line width is reduced down to below 0.5 micron, the problem of the R-NCE gets worse. In particular, the process below 0.35 micron produces serious effect to the device. It was known that the $V_T$ adjustment and the anti-punch through layer provided by performing global implantation gradually lose their effect due to the R-NCE. As a result, $V_T$ is unable to reach an expected value and the MOS transistor can not maintain its normal operation. However, such $V_T$ reduction may cause an increase in the subthreshold current. This leads to a poor reliability for the device while the product yield is reduced.

SUMMARY OF THE INVENTION

The invention provides a method of fabricating a MOS transistor, wherein the method combines a dual threshold voltage process and a local channel implantation for reducing the junction capacitance while improving the device efficiency.

According to the invention, the fabrication method for a MOS transistor is provided, with the STI serving as the device isolation, so that the R-NCE is prevented. Therefore, in the process below 0.25 micron, $V_T$ of the transistor is maintained within the working range so as to improve the reliability of the device.

As embodied and broadly described herein, the invention provides a fabrication method for a MOS transistor. The method involves forming a first gate oxide layer and a second gate oxide layer of different thicknesses on the substrate which is formed with the STI. A plurality of wells isolated with the STI are then formed in the substrate, wherein the wells include a first P-well and a first N-well corresponding to the first gate oxide layer, as well as a second P-well and a second N-well corresponding to the second gate oxide layer. A pattern mask is formed on the first gate oxide layer and the second gate oxide layer, wherein the pattern mask has an opening which exposes a channel from one of the wells. With the pattern mask serving as an ion implantation mask, a local channel implantation is performed to form two implantation regions in one of the wells below the opening for providing the $V_T$ adjustment and the anti-punch through layer, respectively. The pattern mask is then removed. The steps for forming the pattern mask, performing the local channel ion implantation, and removing the pattern mask are repeated in order to form two implantation regions in channels from rest of the well regions. Finally, a gate is formed on the substrate, while a source/drain (S/D) region is formed in the substrate.

The invention provides a method for fabricating a MOS transistor, which method forms a first gate oxide layer and a second gate oxide layer on a substrate formed with a STI. A first well and a second well are then formed in the substrate, wherein the first well and the second well correspond to the first gate oxide layer and the second gate oxide layer respectively. A first implantation region and a second implantation region are formed simultaneously as a whole in the first well and the second well so as to serve as threshold voltage adjustment and anti-punch through, and the first well and the second well are of the same conductive type. Next, a third well and a fourth well are formed in the substrate, wherein the third well and the fourth well correspond to the first gate oxide layer and the second gate oxide layer respectively. A third implantation region and a fourth implantation region are formed simultaneously as a whole in the third well and the fourth well so as to serve as threshold voltage adjustment and anti-punch through. The third well and the fourth well are of the same conductive type but the third well has a different conductive type from the first well and the second well. A local channel ion implantation is performed, so that a fifth implantation region and a sixth implantation region are formed in the channel region of the first well and the third well to provide the threshold voltage adjustment and anti-punch through layer. The R-NCE brought upon by using STI is also prevented in this case. Lastly, a gate is formed on the substrate, while a S/D region is formed in the substrate.

In the layout where the STI serves as a device isolation, ions possessed with certain energy and concentration are selectively doped by local channel implantation into corresponding regions below the gate. This can be effective in preventing the $V_T$ reduction as the gate width decreases. As a result, the problem of the R-NCE is solved with an increase in the product yield. In addition, the implantation region in this case does not extend to the bottom of the S/D region formed subsequently, thus the junction capacitance between the S/D region and the substrate is effectively reduced.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

During the dual threshold voltage process in the invention, a local channel implantation is performed to solve the problem of the R-NCE accompanied by using the shallow trench isolation (STI).

Figure 1:
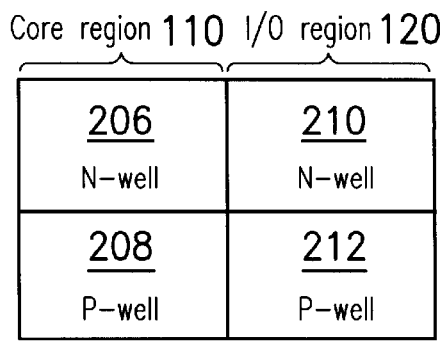
FIG. 1 is a diagram illustrating a main layout for an integrated circuit (IC) chip.

As shown in FIG. 1, a common IC chip is divided into a core region 110 and an input/output (I/O) region 120. Since the core region 110 and the I/O region 120 have different working voltages, they are also different in terms of the transistor design. The core region 110 usually has a lower working voltage, whereas the I/O region 120 has a higher working voltage. Therefore, the gate oxide layer of the core region 110 is thinner than the gate oxide layer of the I/O region 120.

First Embodiment

FIGS. 2A to 2F are schematic diagrams illustrating the fabrication steps for a MOS transistor according to the first embodiment of this invention.

Figure 2A:
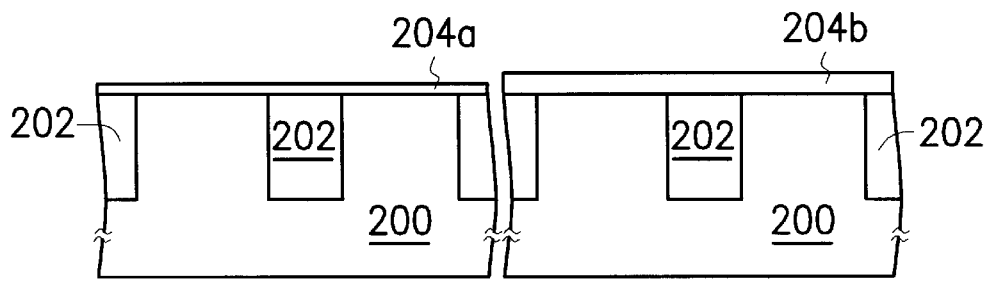
FIGS. 2A to 2F are schematic diagrams illustrating the fabrication steps for a MOS transistor according to the first embodiment of this invention.

Referring to FIG. 2A, a substrate 200, such as a semiconductor silicon substrate, is provided, while a STI 202 for defining an active region, is formed in the substrate. Gate oxide layers 204a and 204b having different thicknesses are formed respectively on the substrate 200 of both the core region 110 and the I/O region 120, wherein the gate oxide layer 204a is thinner than the gate oxide layer 204b. The steps for forming the gate oxide layers 204a and 204b involve forming a first oxide layer having a thickness of 95 Å by thermal oxidation on the surface of the substrate 200, followed by forming a photoresist which covers a region for forming the thicker gate oxide layer. An etching step is then performed until the surface of the substrate 200 is exposed before removing the photoresist. A second oxide layer is formed by thermal oxidation on the surface of the substrate 200, so that a thinner gate oxide layer 204a having a thickness of 65 Å is formed on the exposed surface of substrate 200. On the other hand, the region for forming the thick gate oxide layer continues to increase the thickness of the gate oxide layer up to about 120 Å so as to form the thick gate oxide layer 204b shown in the diagram.

The method further involves forming wells in the substrate 200 before performing local channel implantation, wherein the wells include P-wells 208 and 212, as well as N-wells 206 and 210. Since the P-well 208 and the N-well 206 in the core region 110, and the P-well 212 and the N-well 210 in the I/O region 120 all provide different ways of $V_T$ adjustment and different degrees of anti-punch through, they are applied with different process conditions. In this embodiment, local channel implantation is performed in sequence to the P-well 208 and the N-well 206 in the core region 110 as well as the P-well 212 and the N-well 210 in the I/O region 120. As shown in FIGS. 2B to 2E, the invention is not limited to the sequence of steps described above, because the sequence can be swapped around by all means.

Figure 2B:
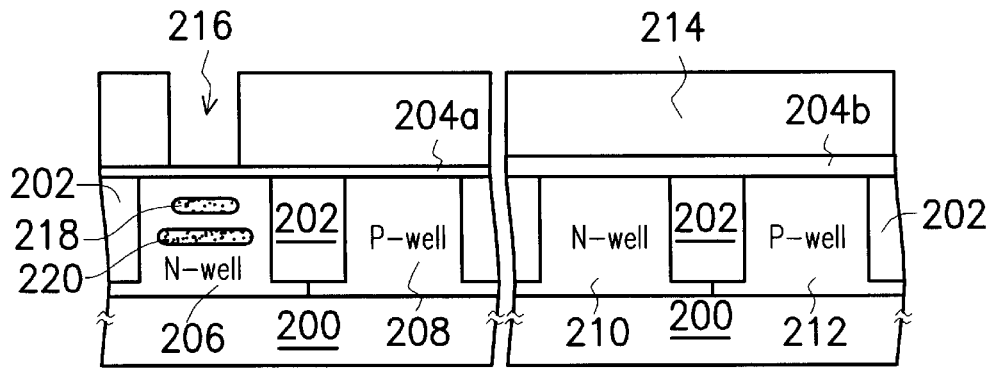

Referring to FIG. 2B, a pattern mask 214 is formed on the gate oxide layers 204a and 204b, wherein the pattern mask 214 may include a photoresist. An opening 216, which corresponds to the channel of the subsequent formed PMOS transistor, is formed in the pattern mask 214. With the pattern mask 214 serving as an ion implantation mask, the local channel implantation is performed, so that an implantation region 218 for adjusting $V_T$ and an implantation region 220 to provide the anti-punch through layer are formed in the N-well 206 of the substrate 200 below the opening 216.

For example, in the process involving with line width of 0.25 micron, the N-well 206 is used to form the PMOS, thus N-type dopants are used in the local channel implantation. Arsenic (As) ions with energy of about 160–230 KeV at a dose of about 3E12–7E12 Atoms/cm$^3$ and phosphorus (P) ions with energy of about 40–70 KeV at a dose of about 1E12–3E12 Atoms/cm$^3$ are doped into the N-well 206 in order to form local implantation regions 218 and 220.

Figure 2C:
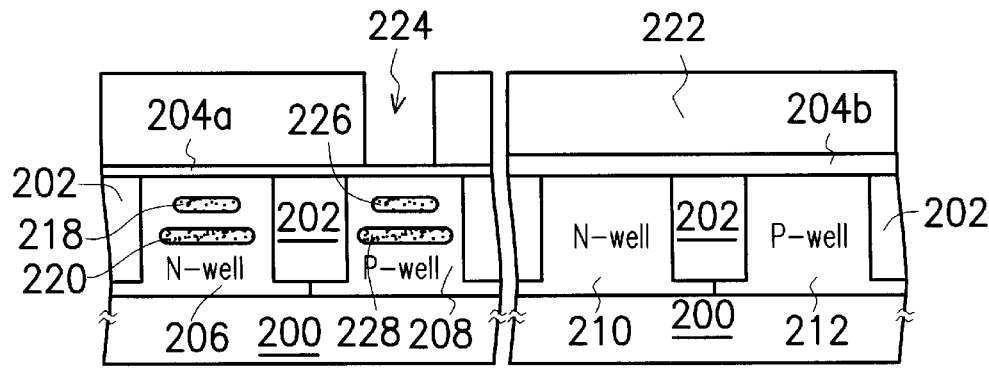

Referring to FIG. 2C, another pattern mask 222 is formed on the gate oxide layers 204a and 204b after removing the pattern mask 214, wherein the pattern mask 222 may include a photoresist. An opening 224, which corresponds to the channel of the subsequent formed NMOS transistor, is formed in the pattern mask 222. With the pattern mask 222 serving as an ion implantation mask, the local channel implantation is performed, so that an implantation region 226 for adjusting $V_T$ and an implantation region 228 serving as the anti-punch through layer are formed in the P-well 208 of the substrate 200 below the opening 224.

For example, in the process involving with line width of 0.25 micron, the P-well 208 is used to form the NMOS, thus P-type dopants are used in the local channel implantation. Boron (B$^+$) ions with energy of about 60–90 KeV at a dose of about 5E12–8E12 Atoms/cm$^3$ and boron fluoride (BF$_2^+$) ions with energy of about 40–60 KeV at a dose of about 1E12–4E12 Atoms/cm$^3$ are doped into the P-well 208 in order to form local implantation regions 226 and 228.

Figure 2D:
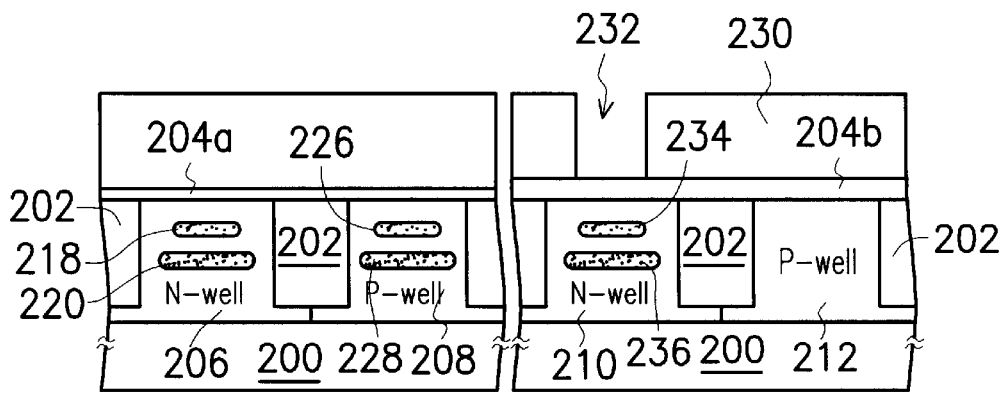

Referring to FIG. 2D, another pattern mask 230 is formed on the gate oxide layers 204a and 204b after removing the pattern mask 222, wherein the pattern mask 230 may include a photoresist. An opening 232, which corresponds to the channel of the subsequent formed PMOS transistor, is formed in the pattern mask 230. With the pattern mask 230 serving as an ion implantation mask, the local channel implantation is performed, so that an implantation region 234 for adjusting $V_T$ and an implantation region 236 to provide the anti-punch through layer are formed in the N-well 210 of the substrate 200 below the opening 232.

Depending on the line width process selected and the working voltage applied to the PMOS, the ion implantation conditions are adjusted and will not be further described here.

Figure 2E:
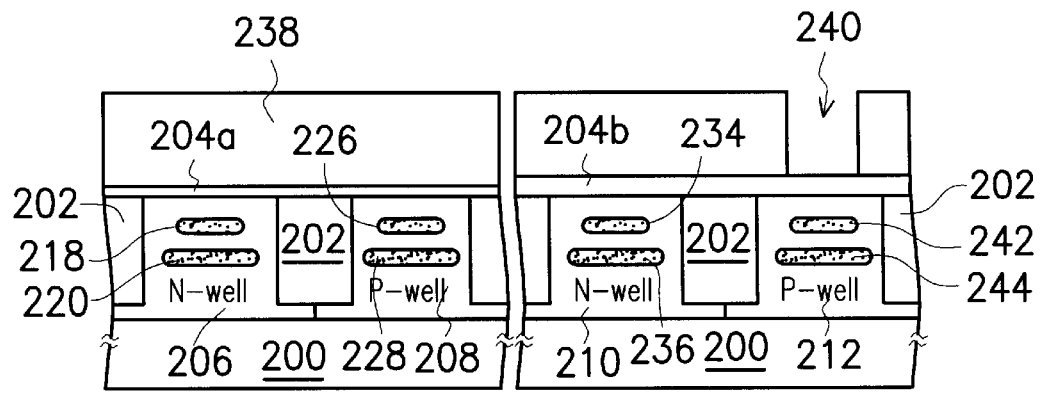

Referring to FIG. 2E, another pattern mask 238 is formed on the gate oxide layers 204a and 204b after removing the pattern mask 230, wherein the pattern mask 238 may include a photoresist. An opening 240, which corresponds to the channel of the subsequent formed NMOS transistor, is formed in the pattern mask 238. With the pattern mask 238 serving as an ion implantation mask, the local channel implantation is performed, so that an implantation region 242 for adjusting $V_T$ and an implantation region 244 to provide the anti-punch through layer are formed in the P-well 212 of the substrate 200 below the opening 240.

Since the masking layers 214, 222, 230, 238 are provided as coverages in the local channel implantation described above, the dopants are selectively introduced into the wells in the substrate 200 below the openings 216, 224, 232, and 240 during the local channel implantation step. While the openings 216, 224, 232, 240 are pre-determined regions for forming the gates, they are excluded for forming the S/ID region.

Figure 2F:
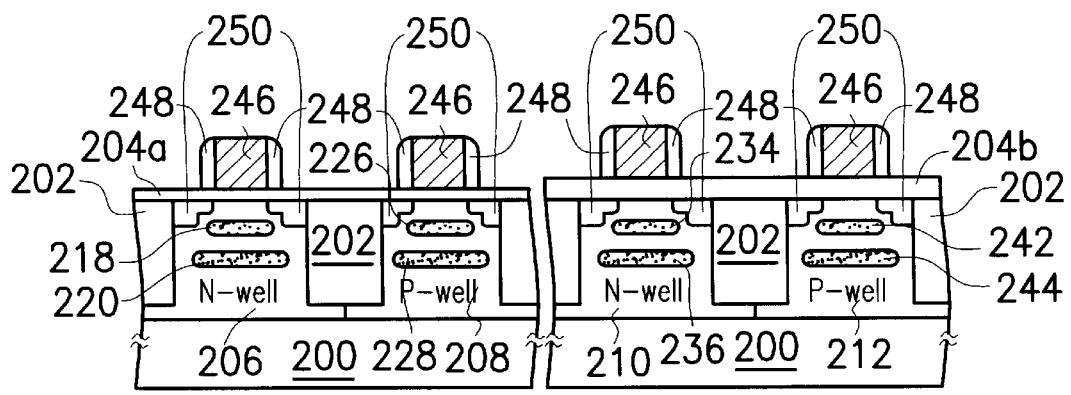

Referring to FIG. 2F, the pattern mask is removed to expose the gate oxide layers 204a and 204b. Gates 246 are then formed on the gate oxide layers 204a and 204b, while spacers 248 are formed on the sidewalls of the gates 246. The S/D regions 250 having lightly doped drains (LDD) are formed in the wells below both sides of the gate. As this part is not essential to the invention, it will not be described in detail here.

As described above, with the STI serving as device isolation, the MOS transistor is manufactured by combining the dual $V_T$ process and the local channel implantation, while an electrical test shows that problems of the R-NCE and the R-SCE can be solved. This indicates that $V_T$ of the transistor increases when the gate length (channel length) increases, but the $V_T$ of the transistor decreases when the gate width increases. Therefore, the reliability of the device is improved when designing the dual threshold voltage device. Furthermore, the invention is also applicable to an electrostatic discharge (ESD) protective device.

Second Embodiment

FIGS. 3A to 3E are schematic diagrams illustrating the fabrication steps for a MOS transistor which combines a dual $V_T$ process and a local channel implantation according to the second embodiment of this invention, so that the R-SCE caused by using the STI is solved.

Figure 3A:
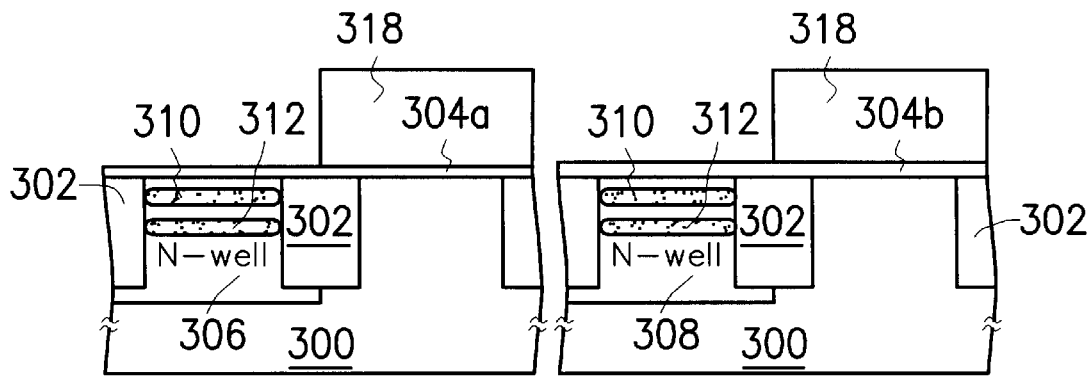
FIGS. 3A to 3E are schematic diagrams illustrating the fabrication steps for a MOS transistor according to the second embodiment of this invention.

Referring to FIG. 3A, a substrate 300 is provided with a STI 302 formed within, wherein the STI 302 serves to define an active region. Gate oxide layers 304a and 304b having different thicknesses are formed on the core region and the I/O region of the substrate 300, respectively. The gate oxide layer 304a is thinner than the gate oxide layer 304b in this case, while the method for forming these layers is not described further here, since it has been described in the first embodiment.

Formation of the well and the ion implantation, which globally adjusts the $V_T$ and provides an anti-punch through layer are then performed, respectively. For example, the N-type ion implantation is performed where a patterned photoresist layer 318, which exposes the core region and the I/O region for forming the N-well, is formed on the gate oxide layers 304a and 304b. With the patterned photoresist layer 318 serving as an implantation mask, a N-well 306 is formed in the core region and a N-well 308 is formed in the I/O region. An implantation region 310 for adjusting $V_T$ and a implantation region 312 for providing anti-punch through layer are then formed in the N-wells 306 and 308, respectively.

Figure 3B:
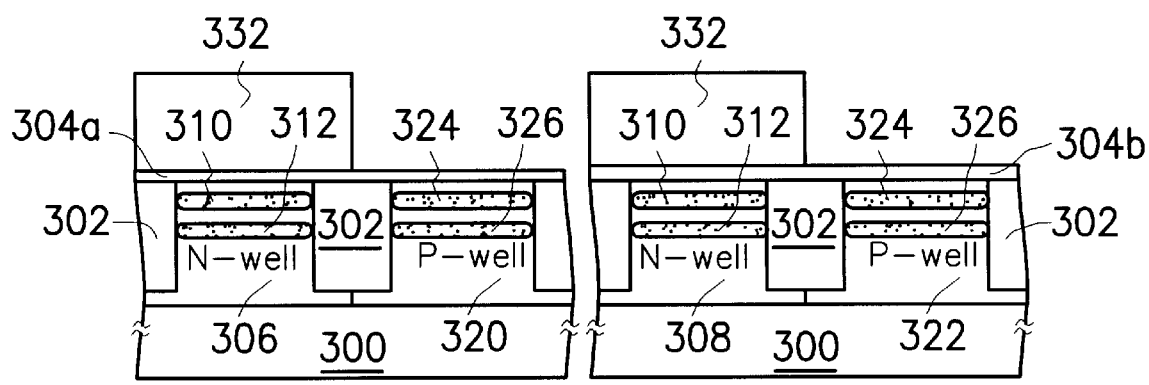

Referring to FIG. 3B, P-type ions are implanted after removing the patterned photoresist layer 318. The method involves forming another patterned photoresist layer 332, which exposes the core region and the I/O region for forming the P-well, on the gate oxide layers 304a and 304b. With the patterned photoresist layer 332 serving as an implantation mask, a P-well 320 is formed in the core region and a P-well 322 is formed in the I/O region. An implantation region 324 for adjusting $V_T$ and a implantation region 326 for providing anti-punch through layer are then formed in the P-wells 320 and 322, respectively.

The order for performing the N-type ion implantation and the P-type ion implantation can be varied in this case.

The local channel implantation is performed in the core region after the patterned photoresist layer 332 is removed in order to prevent the R-SCE caused by using the STI. In contrast, there is no R-SCE in the I/O region, since the I/O region has a smaller integration and a larger line width. Therefore, it is not necessary to perform the local channel implantation in the I/O region.

Figure 3C:
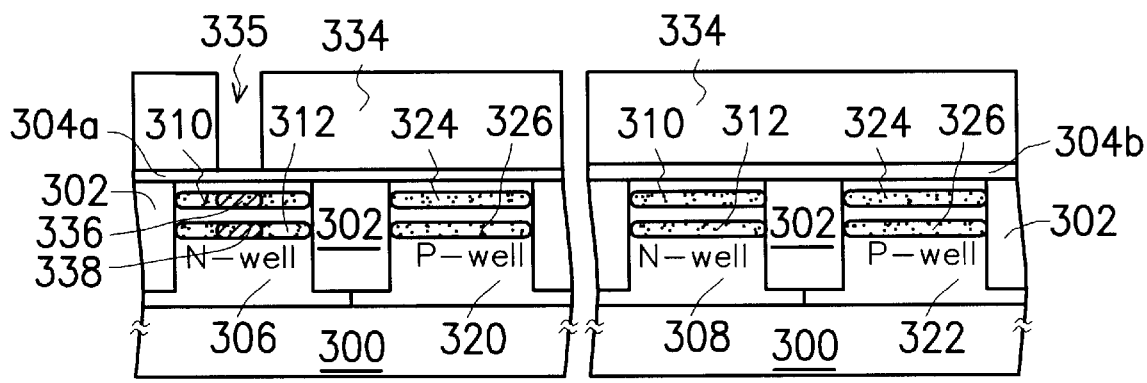

Referring to FIG. 3C, another photoresist layer 334 which exposes a channel region 335 of the N-well 306, is formed on the gate oxide layers 304a and 304b. With the patterned photoresist layer 334 serving as an implantation mask, a local implantation region 336 for adjusting $V_T$ and a local implantation region 338 for providing anti-punch through layer are then formed in the N-well 306.

Figure 3D:
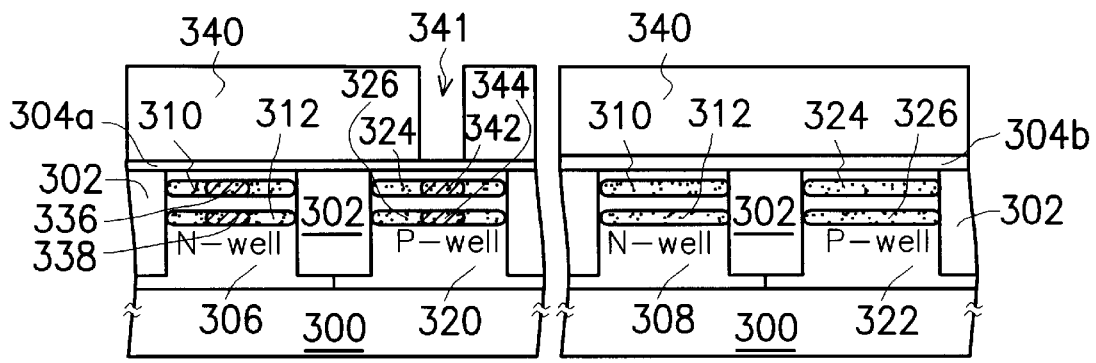

Referring to FIG. 3D, another photoresist layer 340 which exposes a channel region 341 of the P-well 320, is formed on the gate oxide layers 304a and 304b after the patterned photoresist layer 334 is removed. With the patterned photoresist layer 340 serving as an implantation mask, a local implantation region 342 for adjusting $V_T$ and a local implantation region 344 for providing anti-punch through layer are then formed in the P-well 320.

The order to form the local implantation regions 336 and 342 for adjusting $V_T$ and to form the local implantation regions 338 and 344 for providing an anti-punch through layer can be varied in this case.

Figure 3E:
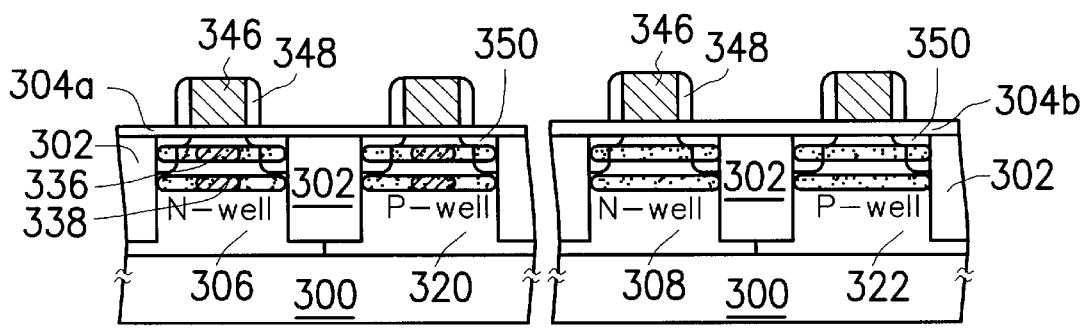

Referring to FIG. 3E, the patterned photoresist layer 340 is removed to expose the gate oxide layers 304a and 304b. A gate 346 is formed on the gate oxide layers 304a and 304b, with a spacer 348 forming on the sidewall of the gate 346. A S/D region 350 having the LDD is formed in the well underneath either sides of the gate 346. Since formation of the gate 346 is not the main emphasis of the invention, it will not be described further in detail here.

Summarizing above, the invention has the following advantages. First of all, in the layout where the STI serves as a device isolation, ions possessed with certain energy and concentration are doped by local channel implantation into the region below the gate. This can effectively prevent the $V_T$ reduction due to a decrease in the gate width. Thus, the R-NCE is improved while the product yield is increased. Since the dopants are selectively introduced into the wells in the substrate during the implantation step for providing the $V_T$ adjustment and the anti-punch through layer, dopants do not extend down below the S/D region. This can effectively reduce the junction capacitance between the S/D region and the substrate. As the junction capacitance between the S/D region and the substrate is lower, the time delay of the gate is reduced, while the device efficiency is increased. Also, the invention combines the dual threshold voltage process and the local channel implantation, so no additional masks or steps are required when compared with the conventional process. Therefore, the invention does not incur any additional process cost.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A fabrication method for a MOS transistor, the method comprising the steps of:

providing a substrate with a shallow trench isolation (STI) formed within;

forming a first gate oxide layer and a second gate oxide layer on the substrate, wherein the first gate oxide layer and the second gate oxide layer are both formed before a local channel ion implantation;

forming a plurality of wells isolated by the STI, wherein the wells include a first P-well and a first N-well corresponding to the first gate oxide layer, as well as a second P-well and a second N-well corresponding to the second oxide layer;

forming a pattern mask on the first gate oxide layer and the second gate oxide layer, wherein the pattern mask has an opening which exposes a channel from one of the wells;

performing the local channel ion implantation where two implantation regions are formed in one of the wells below the opening for adjusting a threshold voltage ($V_T$) and providing an anti-punch through layer, respectively;

removing the pattern mask;

repeating steps for forming the pattern mask, performing the local channel ion implantation, and removing the pattern mask, so that the two implantation regions continue to be formed in sequence in the channels from the rest of the well regions; and forming a plurality of gates on the substrate, while forming source/drain (S/D) regions in the substrate.

2. The fabrication method of claim 1, wherein the first gate oxide layer has a different thickness from the second gate oxide layer.

3. The fabrication method of claim 1, wherein the first gate oxide layer corresponds to a core region, and the second gate oxide layer corresponds to an input/output (I/O) region.

4. The fabrication method of claim 1, wherein the pattern mask includes a photoresist layer.

5. A fabrication method for a MOS transistor, the method comprising steps of:

providing a substrate with a shallow trench isolation (STI) formed within;

forming a first gate oxide layer and a second gate oxide layer on the substrate, wherein the first gate oxide layer and the second gate oxide layer are both formed before a local channel ion implantation;

forming a plurality of wells insulated by the STI;

forming a pattern mask on the substrate, wherein the pattern mask serves as an implantation mask, while performing the local channel ion implantation where two implantation regions are formed in a local region of one of the wells;

removing the pattern mask;

repeating steps for forming the pattern mask, performing the local channel ion implantation, and removing the pattern mask, so that the two implantation regions continue to be formed in sequence in channels from the rest of the well regions; and forming a plurality of gates on the substrate, while forming source/drain (S/D) regions in the substrate.

6. The fabrication method of claim 5, wherein the local region in the wells indicates the channel.

7. The fabrication method of claim 5, wherein the wells include at least a P-well and a N-well.

8. The fabrication method of claim 5, wherein the pattern mask includes a photoresist layer.

9. A method of fabricating a MOS transistor, comprising steps of:

providing a substrate with a shallow trench isolation (STI) formed within;

forming a first gate oxide layer and second gate oxide layer on the substrate, wherein the first gate oxide layer and the second gate oxide layer are both formed before a local channel ion implantation;

forming a first well and a second well in the substrate, wherein the first well and the second well correspond to the first gate oxide layer and the second gate oxide layer, respectively, while a first implantation region and a second implantation region are formed simultaneously as a whole in the first well and the second well so as to serve as threshold voltage adjustment regions and anti-punch through regions, and the first well and the second well are of the same conductive type;

forming a third well and a fourth well in the substrate, wherein the third well and fourth well correspond to the first gate oxide layer and the second gate oxide layer, respectively, while a third implantation region and a fourth implantation region are formed simultaneously as a whole in the third well and the fourth well so as to provide a threshold voltage adjustment and an anti-punch through layer, and the third well and the fourth well are of the same conductive type but is different from that of the first well and the second well;

performing the local channel ion implantation, so that a fifth implantation region and a sixth implantation region are formed in a channel region of the first well and the third well, respectively, to provide the threshold voltage adjustment and the anti-punch through layer; and forming a plurality of gates on the substrate, while forming source/drain (S/D) regions in the substrate.

10. The fabrication method of claim 9, wherein the first gate oxide layer has a different thickness from the second gate oxide layer.

11. The fabrication method of claim 9, wherein the first gate oxide layer corresponds to a core region, and the second gate oxide layer corresponds to an input/output (I/O) region.

* * * * *